(12) United States Patent
Ahn et al.

(10) Patent No.: US 7,384,823 B2
(45) Date of Patent: Jun. 10, 2008

(54) METHOD FOR MANUFACTURING A SEMICONDUCTOR DEVICE HAVING A STABILIZED CONTACT RESISTANCE

(75) Inventors: Hyun Ahn, Seongnam-si (KR); Ju Hee Lee, Chuncheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 170 days.

(21) Appl. No.: 11/120,573

(22) Filed: May 2, 2005

(65) Prior Publication Data

US 2006/0019489 A1    Jan. 26, 2006

(30) Foreign Application Priority Data

Jul. 21, 2004    (KR)    .................... 10-2004-0056757

(51) Int. Cl.
*H01L 21/82* (2006.01)
*H01L 21/3205* (2006.01)
(52) U.S. Cl. .................... 438/128; 438/585
(58) Field of Classification Search ............. 438/618, 438/622, 637, 254, 672, 675, 303; 257/774, 257/758
See application file for complete search history.

(56) References Cited

U.S. PATENT DOCUMENTS

| 5,888,906 | A * | 3/1999 | Sandhu et al. | 438/706 |
|---|---|---|---|---|
| 6,350,665 | B1 * | 2/2002 | Jin et al. | 438/585 |
| 6,531,382 | B1 * | 3/2003 | Cheng et al. | 438/597 |
| 6,551,894 | B1 * | 4/2003 | Kohyama et al. | 438/396 |
| 6,686,288 | B1 * | 2/2004 | Prall et al. | 438/706 |
| 2002/0115310 | A1 * | 8/2002 | Ueda | 438/945 |
| 2002/0140100 | A1 * | 10/2002 | Yokoyama | 257/760 |
| 2002/0142555 | A1 * | 10/2002 | Cha | 438/303 |
| 2003/0003712 | A1 * | 1/2003 | Kwon et al. | 438/630 |
| 2003/0102561 | A1 * | 6/2003 | Ando | 257/758 |
| 2003/0203605 | A1 * | 10/2003 | Mori et al. | 438/586 |
| 2004/0082184 | A1 * | 4/2004 | Suzuki | 438/706 |
| 2005/0272245 | A1 * | 12/2005 | Choi et al. | 438/618 |
| 2006/0105569 | A1 * | 5/2006 | Kim | 438/675 |

FOREIGN PATENT DOCUMENTS

| JP | 10-050962 | 2/1998 |
|---|---|---|
| KR | 2000-026138 | 5/2000 |

* cited by examiner

*Primary Examiner*—David Vu
*Assistant Examiner*—Andres Lopez Esquerra
(74) *Attorney, Agent, or Firm*—Townsend and Townsend and Crew LLP

(57) ABSTRACT

Disclosed is a method for forming a storage node contact of a semiconductor device. In such a method, there is provided a substrate formed with gates and source/drain regions. A landing plug poly is formed between the gates, and an insulating interlayer is formed over the entire surface of the substrate including the landing plug poly and the gates. The insulating interlayer is then etched to form a storage node contact hole exposing the landing plug poly. Thereafter, the landing plug poly exposed through the storage node contact hole is removed. Finally, a polysilicon film is filled up within a vacant portion from which the landing plug poly is removed and the storage node contact hole above the vacant portion.

6 Claims, 5 Drawing Sheets

METHOD FOR MANUFACTURING A SEMICONDUCTOR DEVICE HAVING A STABILIZED CONTACT RESISTANCE

BACKGROUND OF THE INVENTION

1. Field of the Invention

The present invention relates generally to a method for manufacturing a semiconductor device, and more particularly to a method for forming a storage node contact of a semiconductor device, which can improve contact resistance while preventing misalignment between a landing plug poly and the storage node contact.

2. Description of the Prior Art

As an area available for forming a pattern decreases and a level difference increases due to high integration of semiconductor devices, it has become difficult to form a contact between a storage node and a substrate. Thus, in order to solve process difficulties caused by a high level difference, that is, in order to ensure a contact margin between a storage contact and a substrate, there has been universalized a technology in which a storage node contact is formed prior to the formation of the storage node.

Hereinafter, a conventional method for forming a storage node contact will be described in conjunction with FIGS. 1A to 1D.

Referring to FIG. 1A, a gate insulating film 13a, a gate conductive film 13b and a nitride film 13c as a hard mask are successively formed on a semiconductor substrate 11 on which a device separating film 12 has been formed, and then are patterned to form gates 13. Thereafter, spacers 14 are formed on both sidewalls of the respective gates 13 and then source/drain regions 15 are formed under substrate surfaces between the gates 13, including the spacers 14.

Next, after a first insulating interlayer 17 is deposited on the resultant substrate structure, a surface of the first insulating interlayer 17 is planarized and then the surface-planarized first insulating interlayer 17 is etched to form a landing plug contact which simultaneously exposes several gates 13 and substrate regions between the gates 13. Thereafter, a polysilicon film is deposited on the first insulating interlayer such that the landing plug contact is filled up. Then, the polysilicon film and the first insulating interlayer 17 are subjected to Chemical Mechanical Polishing (CMP) until the nitride film 13c as a hard mask is exposed to form a landing plug poly 18 on substrate regions between the gates 13.

Referring to FIG. 1B, a bit line (not shown) to be connected to a specific landing plug contact is formed on the entire surface of the substrate including the landing plug poly 18 and the gates 13. Here, the bit line is not shown in this figure because it is perpendicular to gate line. Thereafter, a second insulating interlayer 19 is deposited on the resultant substrate structure according to any well-known process such that the bit line is covered with the second insulating interlayer and then a surface of the second insulating interlayer is planarized.

Referring to FIG. 1C, the second insulating interlayer 19 is etched according to any well-known process to form a storage node contact hole H which exposes the landing plug poly 18.

Referring to FIG. 1D, the storage node contact hole H is filled up with a polysilicon film to form a storage node contact 20.

Such a conventional method for forming a storage node contact has a problem in that it is difficult to provide alignment between the landing plug contact and the storage node contact with decrease in contact area due to the high integration of semiconductor devices. Also, there is another problem of increase in resistance between the landing plug contact and the storage node contact.

SUMMARY OF THE INVENTION

Accordingly, the present invention has been made to solve the above-mentioned problem occurring in the prior art, and an object of the present invention is to provide a method for forming a storage node contact of a semiconductor device, which can improve contact resistance while preventing misalignment between a landing plug poly and the storage node contact.

In order to accomplish this object, there is provided a method for forming a storage node contact in accordance with the present invention, the method comprising the steps of: providing a substrate being formed with gates and source/drain regions; forming a landing plug poly between the gates; forming an insulating interlayer over the entire surface of the substrate including the landing plug poly and the gates; etching the insulating interlayer to form a storage node contact hole which exposes the landing plug poly; removing the landing plug poly exposed through the storage node contact hole; and filling up a polysilicon film within a vacant portion from which the landing plug poly is removed and the storage node contact hole above the vacant portion.

Here, the step of removing the landing plug poly is carried out by means of a high-selectivity poly etching process with a lower bias characteristic so as to minimize damages of the gates during the removal of the landing plug poly, and the poly etching process is performed using inductive coupled plasma.

Preferably, the high-selectivity poly etching process is conducted using C12 gas and HBr gas, and an oxide film is formed on substrate surfaces between the gates before the step of forming the landing plug poly so as to prevent the substrate from being etched during the high-selectivity poly etching process.

Also, it is preferred that nitride film spacers are formed on sidewalls of gates, and the resultant substrate structure on which the nitride film spacers are formed is cleaned after the step of removing the landing plug poly and before the step of filling up the polysilicon film. At this time, the nitride film spacers are formed with a thickness of 10 nm or less.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
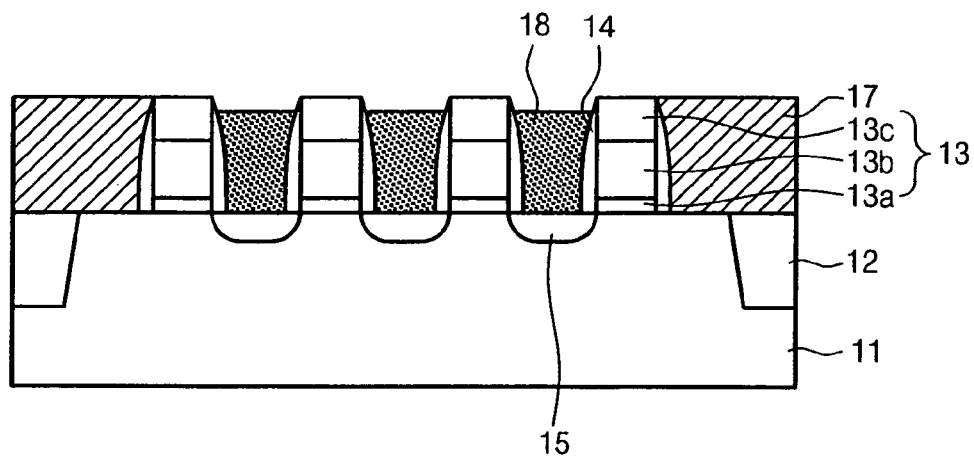
FIGS. 1A to 1D are process-by-process sectional views for explaining a method for forming a storage node contact of a semiconductor device according to the prior art.
Figure 1B:
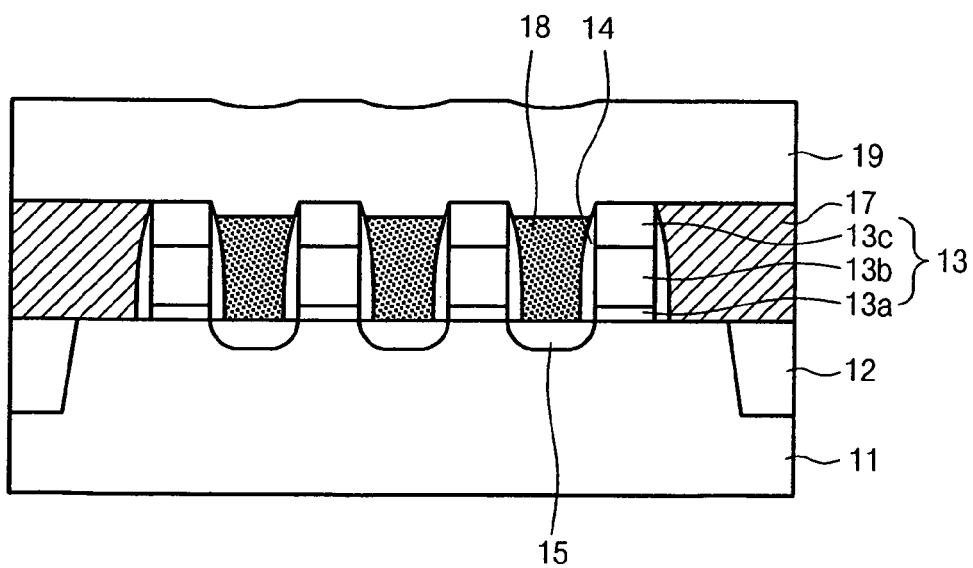
Figure 1C:
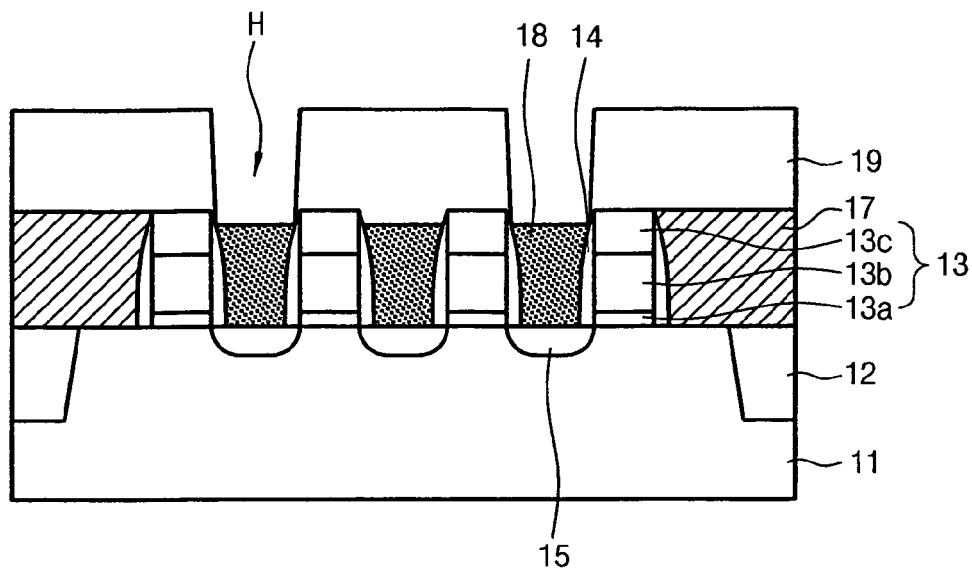
Figure 1D:
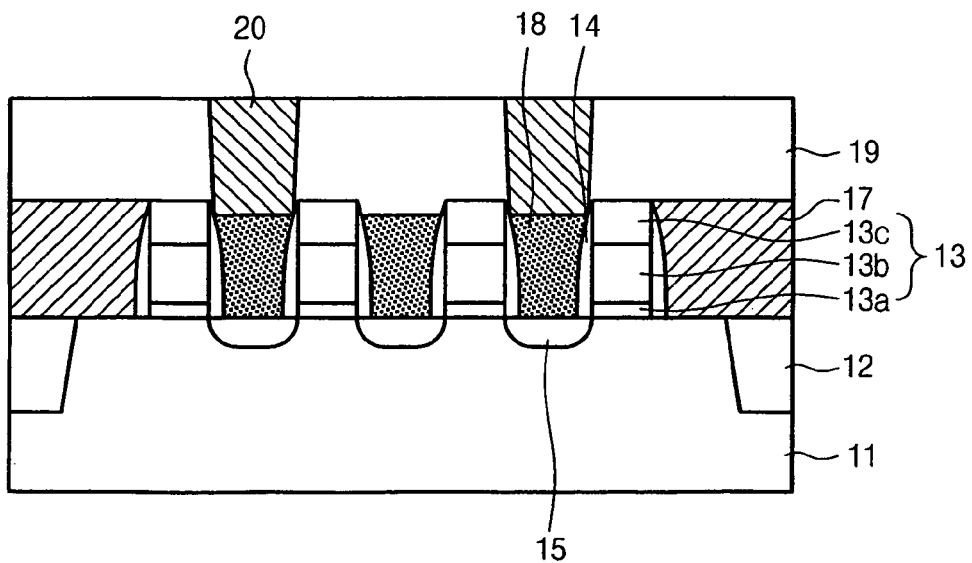

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A to 2E illustrate process-by-process sectional view for explaining a method for forming a storage node contact of a semiconductor device in accordance with a preferred embodiment of the present invention.

Figure 2A:
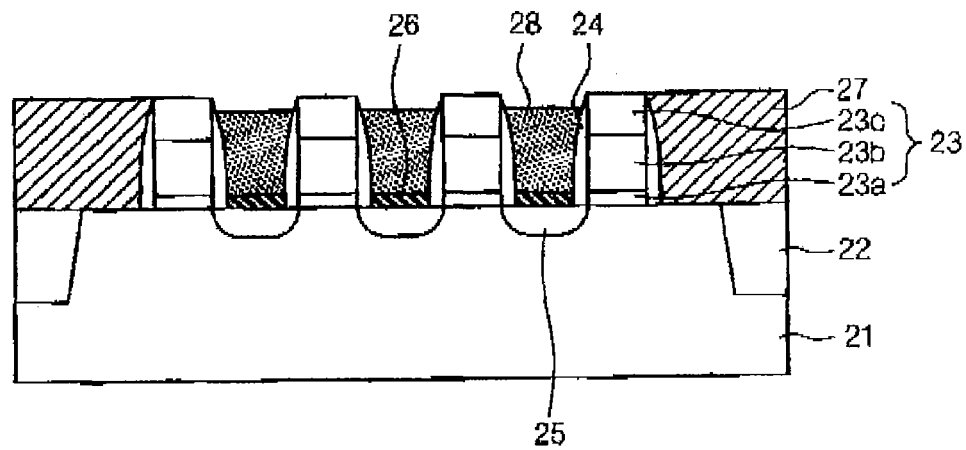
FIGS. 2A to 2E are process-by-process sectional view for explaining a method for forming a storage node contact of a semiconductor device in accordance with a preferred embodiment of the present invention.

Referring to FIG. 2A, a gate insulating film 23a, a gate conductive film 23b and a nitride film 23c as a hard mask are successively formed on a semiconductor substrate 21 on which a device separating film 22 has been formed, and then are patterned to form gates 23. Thereafter, an insulating film is deposited and blanket-etched to form spacers 24 on both sidewalls of the respective gates 23 and then impurities are ion-implanted into substrate surfaces between the gates 23, including the spacers 24, to form source/drain regions 25 under the substrate surfaces.

Next, after a first insulating interlayer 27 is deposited on the resultant substrate structure such that spaces between the spacers 24 are filled up, and a surface of the first insulating interlayer 27 is planarized. The surface-planarized first insulating interlayer 27 is then etched to form a landing plug contact which simultaneously exposes several gates 23 and substrate regions between the gates. Thereafter, the substrate surface on which the landing plug contact has been formed is oxidized to form an oxide film 26. In succession, a polysilicon film is deposited on the first insulating interlayer 27 such that the landing plug contact is filled up. Subsequently, the polysilicon film and the first insulating interlayer 27 are subjected to CMP-until the nitride film 23c as a hard mask of the gates 23 is exposed to form a landing plug poly 28 on substrate regions between the gates 23.

Here, forming the oxide film 26 before the formation of the landing plug poly 28 is intended to prevent the substrate from being etched during a high-selectivity poly etching process.

Figure 2B:
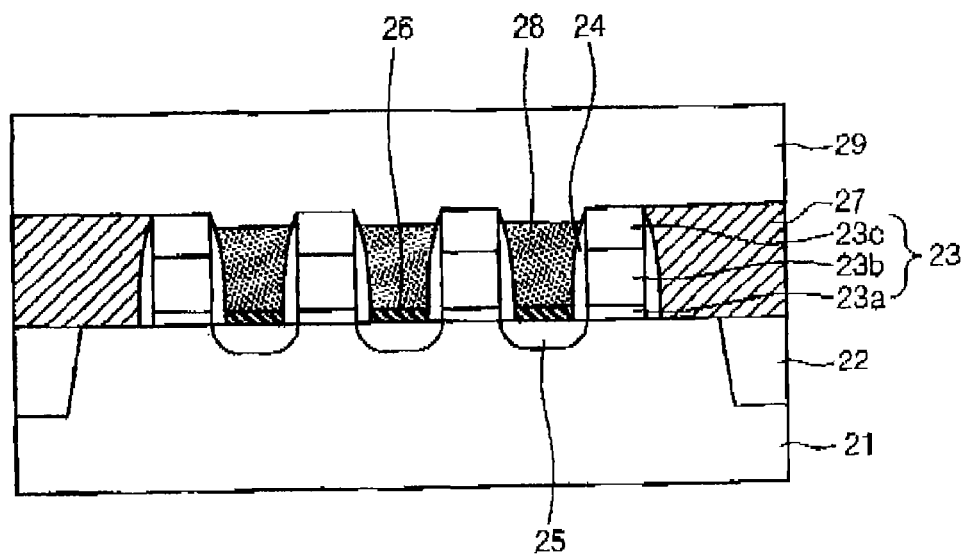

Referring to FIG. 2B, a second insulating interlayer 29 is formed on the entire surface of the substrate including the landing plug poly 28 and the gates 23.

Figure 2C:
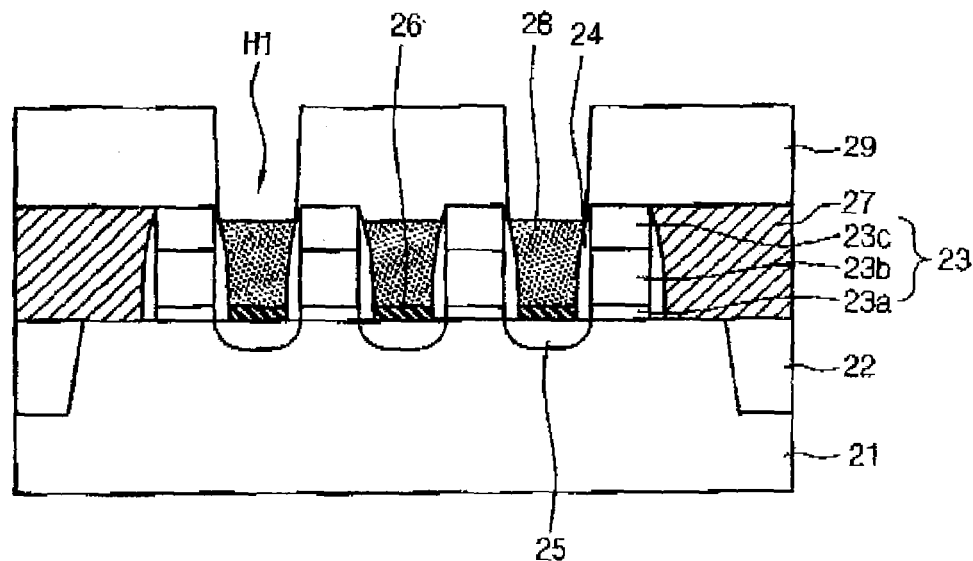

Referring to FIG. 2C, the second insulating interlayer 29 is etched to form a first storage node contact hole H1 which exposes the landing plug poly 28.

Figure 2D:
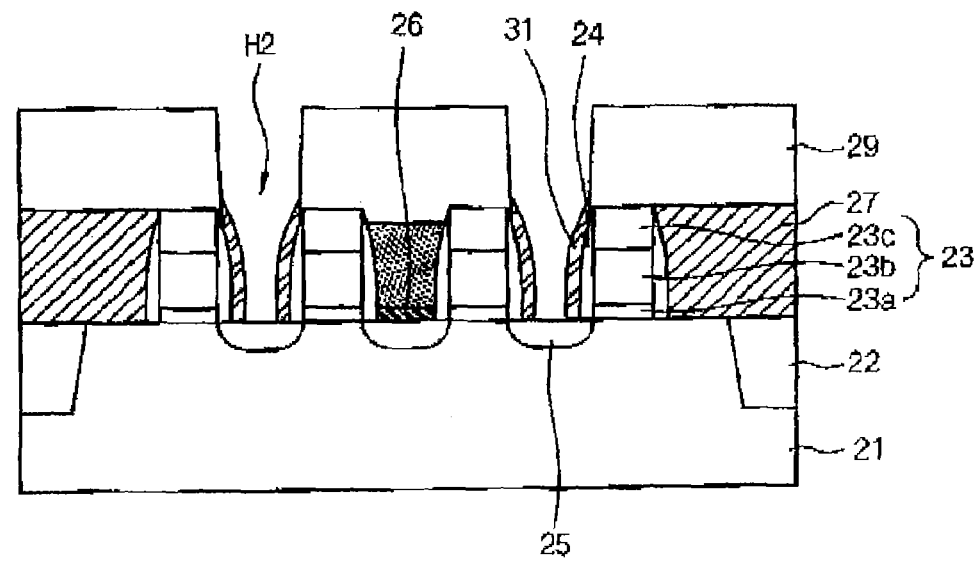

Referring to FIG. 2D, the landing plug poly 28 having been exposed through the first storage node contact hole H1 is removed to form a second storage node contact hole H2. At this time, the removal of the landing plug poly 28 is carried out by means of a high-selectivity poly etching process with a lower bias characteristic so as to minimize damages of the gates 23 during the removal process, and the poly etching process is performed using inductive coupled plasma. C12 gas and HBr gas are used for the high-selectivity poly etching process.

Figure 2E:
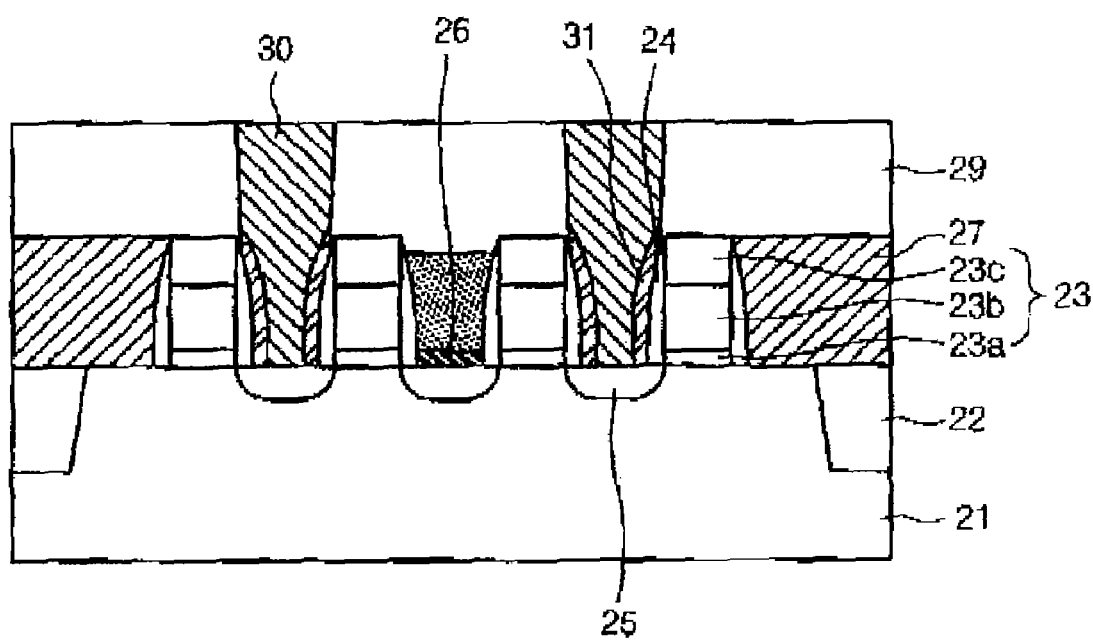

Referring to FIG. 2E, a polysilicon film is filled up with a vacant portion from which the second storage node contact hole H2 including a vacant portion from which the landing plug poly is removed and the first storage node contact hole above the vacant portion to form a storage node contact 30. Here, nitride film spacers 31 are formed on sidewalls of gates over the spacers 24, and the resultant substrate structure on which the nitride film spacers 31 are formed is cleaned after the step of removing the landing plug poly and before the step of filling up the polysilicon film. At this time, the nitride film spacers 31 are formed with a thickness of 10 nm or less.

In forming the storage node contact, if the landing plug poly located at the bottom is all removed, etching is performed until substrate silicon is exposed and then a plug poly is deposited as stated above, it is possible to improve and stabilize contact resistance because all from the substrate silicon to the storage node poly are integrally formed.

A technical problem to be solved in using this process is to etch plug poly silicon while minimizing damages of the nitride and oxide films protecting the gate electrodes.

By reason of this, the high-selectivity ploy etching process is used. Also, the substrate silicon surface is oxidized to form an oxide film after the etching process of the landing plug contact in order that etching of the substrate silicon may not progress by the poly etching process during the plug poly etching process. The so-formed oxide film is used as a stopper which enables the poly to be overetched during the subsequent plug poly etching process. In order to minimize an influence of a cleaning process performed before the deposition of the integral poly, nitride thin film spacers are employed as sidewall protecting films of the gate electrodes and can be used as a stopper for overetching of the cleaning process.

As describes above, in the method for forming a storage node contact according to the present invention, a substrate and a storage node poly are integrally formed, so that interface resistance can be reduced and stabilization of a semiconductor device can be realized.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a storage node contact, the method comprising the steps of:
   providing a substrate being formed with gates and source/drain regions;
   forming an oxide film on the substrate between adjacent gates;
   forming a landing plug poly over the oxide film between the gates and exposing a surface of the gates;
   forming an insulating interlayer over the landing plug poly and the gates;
   etching the insulating interlayer to form a storage node contact hole which exposes the landing plug poly;
   etching the landing plug poly exposed through the storage node contact hole and etching the oxide film such that the landing plug poly and the oxide film are removed thereby forming a vacant portion below the storage node contact hole, wherein the substrate is exposed to the vacant portion, the oxide film preventing the substrate from being etched; and
   filling up a polysilicon film within the vacant portion and the storage node contact hole, wherein the polysilicon film is in contact with the substrate that is exposed to the vacant portion.

2. The method as claimed in claim 1, wherein etching the landing plug poly and the oxide film is a high-selectivity poly etching process with a lower bias characteristic so as to minimize damage to the gates while etching the landing plug poly.

3. The method as claimed in claim 2, wherein the poly etching process is performed using inductive coupled plasma.

4. The method as claimed in claim 2, wherein the high-selectivity poly etching process is conducted using C12 gas and HBr gas.

5. The method as claimed in claim 1, further comprising the steps of:
   forming nitride film spacers on sidewalls of the gates; and
   cleaning the resultant substrate structure on which the nitride film spacers are formed,
   wherein the nitride film forming step and the cleaning step are performed after the step of etching the landing plug poly and the oxide film and before the step of filling up the polysilicon film.

6. The method as claimed in claim 5, wherein the nitride film spacers are formed with a thickness of 10 nm or less.

* * * * *